United States Patent
Broyde et al.

(10) Patent No.: US 8,338,992 B2
(45) Date of Patent: Dec. 25, 2012

(54) TRANSMISSION DEVICE USING A PLURALITY OF ELEMENTARY RETURN CONDUCTORS

(75) Inventors: Frédéric Broyde, Maule (FR); Evelyne Clavelier, Maule (FR)

(73) Assignee: EXCEM, Maule (FR)

( * ) Notice: Subject to any disclaimer, the term of this patent is extended or adjusted under 35 U.S.C. 154(b) by 56 days.

(21) Appl. No.: 13/167,336

(22) Filed: Jun. 23, 2011

(65) Prior Publication Data

US 2011/0248577 A1 Oct. 13, 2011

Related U.S. Application Data

(63) Continuation of application No. PCT/IB2009/055295, filed on Nov. 23, 2009.

(51) Int. Cl.
*H01B 7/30* (2006.01)
*H01B 11/00* (2006.01)
*H02B 1/20* (2006.01)

(52) U.S. Cl. ....................................... 307/147
(58) Field of Classification Search .................... 307/147
See application file for complete search history.

(56) References Cited

U.S. PATENT DOCUMENTS

| | | | |
|---|---|---|---|
| 5,638,322 A | 6/1997 | Lacey | |
| 5,644,574 A | 7/1997 | Wiley | |
| 5,818,261 A | 10/1998 | Perner | |
| 5,994,925 A | 11/1999 | Sessions | |
| 7,099,395 B1 | 8/2006 | Sidiropoulos et al. | |
| 7,167,019 B2 * | 1/2007 | Broyde et al. | 326/30 |
| 7,362,130 B2 * | 4/2008 | Broyde et al. | 326/30 |
| 2006/0267633 A1 | 11/2006 | King | |
| 2007/0046389 A1 | 3/2007 | Dreps et al. | |

FOREIGN PATENT DOCUMENTS

| | | |
|---|---|---|
| FR | 0705260 | 1/2009 |
| FR | 0804429 | 2/2010 |
| FR | 0804430 | 2/2010 |
| WO | 2009013644 A1 | 1/2009 |
| WO | 2010015947 A1 | 2/2010 |
| WO | 2010015948 A1 | 2/2010 |

OTHER PUBLICATIONS

Search Report for International Patent Application No. PCT/IB2009/055295; Mar. 18, 2010.
Broyde et al.; A new pseudo-differential transmission scheme for on-chip and on-board interconnections; Proc. of the CEM 08 Int. Symp. on Electromagnetic Compatibility; Paris; May 2008; session C7.
Broyde et al.; Pseudo-differential links using a wide return conductor and a floating termination circuit; Proc. of the 2008 IEEE Int. Midwest Symp. on Circuits and Systems (MWSCAS); Aug. 10-13, 2008; Knoxville, USA; pp. 586-589.

* cited by examiner

*Primary Examiner* — Hal Kaplan
(74) *Attorney, Agent, or Firm* — Barnes & Thornburg LLP

(57) ABSTRACT

The invention relates to a device for pseudo-differential transmission through interconnections used for sending a plurality of electrical signals. An interconnection comprises 4 transmission conductors and 5 elementary return conductors which are distinct from the reference conductor. One end of the interconnection is connected to a termination circuit. A transmitting circuit receives at its input the signals from the 4 channels of a source, and is connected to the conductors of the interconnection. Each output signal of a receiving circuit is mainly determined by one or more of the voltages between one of its signal terminals connected to the transmission conductors and its common terminal connected to the elementary return conductors. The signals of the 4 channels of the source are sent to the four channels of the destinations without noticeable external crosstalk.

11 Claims, 10 Drawing Sheets

TRANSMISSION DEVICE USING A PLURALITY OF ELEMENTARY RETURN CONDUCTORS

CROSS REFERENCE TO RELATED APPLICATIONS

This is a Continuation application of PCT application PCT/IB2009/055295, filed 23 Nov. 2009, published in English under No. WO 2010/082093, which in turn claims priority to French patent application Ser. No. 09/00161 filed 15 Jan. 2009 and entitled "Dispositif de transmission utilisant une pluralité de conducteurs de retour élémentaires", both of which are incorporated herein by reference.

FIELD OF THE INVENTION

The invention relates to a device for pseudo-differential transmission through interconnections used for sending a plurality of electrical signals, such as the interconnections made with multiconductor cables, or with the traces of a printed circuit board, or inside an integrated circuit.

PRIOR ART

Let us consider the problem of transmission through an interconnection, for obtaining m transmission channels, m being an integer greater than or equal to 2. Each transmission channel may be used for transmitting signals of any type, for instance analog signals or digital signals, from a source to a destination. We consider here that a digital signal is a signal whose value is defined only at discrete points in time, the set of the values that the signal may take on being discrete. We consider also that each value of a digital signal corresponds to a voltage or current interval. This definition of a digital signal as a "digital signal defined by voltage or current intervals" includes:

the binary signals used in binary signaling, that is to say any signal such that, in each transmission channel, the set of the values that this signal may take on has 2 elements;

the N-ary signals (N being an integer greater than or equal to 3) used in multilevel signaling, that is to say any signal such that, in each transmission channel, the set of the values that this signal may take on has N elements.

Binary signals are the signals which are the most frequently used today by digital integrated circuits. Multilevel signals, for instance quaternary signals (sometimes referred to as PAM-4 or 4-PAM), are used to obtain high bit rates. We will consider that any signal which does not comply with this definition of a digital signal is an analog signal. Thus, the result of any type of modulation of a carrier by a digital signal will be regarded as an analog signal.

We shall consider three transmission impairments: echo, internal crosstalk and external crosstalk. Internal crosstalk refers to crosstalk within the interconnection, between the different transmission channels. External crosstalk refers to crosstalk involving couplings between the interconnection and the external world.

There are transmission methods intended to provide a good protection against external crosstalk: differential links (see for instance the book of H. W. Johnson and M. Graham entitled *High-speed digital design: a handbook of black magic*, published by Prentice Hall PTR in 1993), and pseudo-differential links (see for instance the section II of the paper of A. Carusone, K. Farzan and D. A. Johns entitled "Differential signaling with a reduced number of signal paths" published in *IEEE Transactions on Circuits and Systems II*, vol. 48, No. 3, pp. 294-300 in March 2001 and the section 4.2.3 of the book of F. Yuan entitled *CMOS current-mode circuits for data communications*, published by Springer in 2007).

A differential device for transmission providing m transmission channels uses an interconnection having n=2m transmission conductors. A pseudo-differential transmission device providing m transmission channels uses an interconnection having n=m transmission conductors and a common conductor distinct from the reference conductor (ground). The common conductor is referred to as "return conductor" in the case of the pseudo-differential transmission scheme disclosed in the French patent application number 07/05260 of 20 Jul. 2007 entitled "Procédé et dispositif pour les transmissions pseudo-différentielles", corresponding to the international application number PCT/IB2008/052102 of 29 May 2008 (WO 2009/013644), entitled "Method and device for pseudo-differential transmission".

It should be noted that the wording "pseudo-differential" is also applied to devices which are not related in any way to pseudo-differential transmission. For instance, the patent application number US 2006/0267633 of the United States of America entitled "Pseudo-differential output driver with high immunity to noise and jitter" relates to a device having one differential input channel and one single-ended output channel: this device is not related to pseudo-differential transmission in any way. For instance, the U.S. Pat. No. 5,638,322 entitled "Apparatus and method for improving common mode noise rejection in pseudo-differential sense amplifiers" relates to sense amplifiers which to some extent look like conventional differential amplifiers: this invention is not related to pseudo-differential transmission in any way.

A pseudo-differential transmission device providing m=4 transmission channels is shown in FIG. 1, this device comprising an interconnection (1) having n=4 transmission conductors (11) (12) (13) (14) plus a common conductor (10) distinct from the reference conductor (7).

In FIG. 1, the transmitting circuit (5) receives at its input the signals of the m channels of the source (2), and its n output terminals are connected to the n transmission conductors (11) (12) (13) (14) of the interconnection (1). Close to the transmitting circuit (5), the common conductor (10) is grounded. The receiving circuit (6) has its n+1 input terminals connected to the conductors (10) (11) (12) (13) (14) of the interconnection (1), one of these conductors being the common conductor (10). The receiving circuit (6) produces voltages at its output terminals connected to the destination (3), each of these voltages being determined by one and only one of the voltages between one of the transmission conductors (11) (12) (13) (14) and the common conductor (10). The device shown in FIG. 1 provides m transmission channels, such that the signals of the m channels of the source (2) are sent to the m channels of the destination (3).

In FIG. 1, there is no termination circuit, as is the case in the patent of the U.S. Pat. No. 5,818,261 entitled "Pseudo-differential bus driver/receiver for field programmable devices", in the patent of the U.S. Pat. No. 5,994,925 entitled "Pseudo-differential logic receiver" and in the patent of the U.S. Pat. No. 7,099,395 entitled "Reducing coupled noise in pseudo-differential signaling". Consequently, in the case of FIG. 1, substantial reflections of signals occur, and the specialists know that this implies limitations on the length L of the interconnection (L must be sufficiently small) and on the available bandwidth.

In FIG. 1, since no termination is present, there is no constraint on the manner of routing the interconnection (1) with respect to ground (7). Consequently, in FIG. 1, the reference conductor (7) is represented as an irregular geometrical shape, such that the distance between the conductors of the interconnection (1) and the reference conductor (7) varies as a function of the curvilinear abscissa z along the interconnection (i.e. the arc length measured from the origin). This implies that it is a priori not possible to model propagation in the interconnection using a uniform multiconductor transmission line (a uniform multiconductor transmission line being a multiconductor transmission line having uniform electrical characteristics over its length) having n+2=6 conductors.

The FIGS. 2 and 3 show each a cross section of the interconnection (1) and the reference conductor (7), in a plane orthogonal to the direction of propagation of signals, for interconnections built in or on a printed circuit board. FIG. 2 corresponds to a microstrip structure comprising the conductors of the interconnection (10) (11) (12) (13) (14) and a reference conductor (7) made of a ground plane. FIG. 3 corresponds to a stripline structure comprising the conductors of the interconnection (10) (11) (12) (13) (14) and a reference conductor (7) made of an upper ground plane (71) and a lower ground plane (72), these two ground planes being sufficiently connected the one to the other, using vias (not shown in FIG. 3). The lower ground plane (72) could for instance be replaced with a power plane. In this case, the connections between the two planes (71) (72) would be made through capacitors. The interconnections-ground structures shown in the FIGS. 2 and 3 may be used in the pseudo-differential transmission device shown in FIG. 1. Said French patent application number 07/05260 and the corresponding international application explain some of the limitations of the pseudo-differential transmission device shown in FIG. 1 and the interconnections-ground structures shown in FIG. 2 and FIG. 3.

The method disclosed in said French patent application number 07/05260 and the corresponding international application overcomes these limitations and is very effective for reducing external crosstalk and echo. However, this method does not reduce internal crosstalk. For instance, the article of F. Broydé and E. Clavelier entitled "A new pseudo-differential transmission scheme for on-chip and on-board interconnections" published in the proceedings of the "14$^{ème}$ colloque international sur la compatibilité électromagnétique—CEM 08", which took place in Paris, France, in May 2008, shows that this method does not provide a reduction of internal crosstalk. For instance, the article of F. Broydé and E. Clavelier entitled "Pseudo-differential links using a wide return conductor and a floating termination circuit", published in the proceedings of the "2008 IEEE International Midwest Symposium on Circuits and Systems (MWSCAS)", which took place in Knoxville, Tenn., in the United States of America, in August 2008, also indicates that internal crosstalk is present in a pseudo-differential link using the method of said French patent application number 07/05260 and the corresponding international application.

The French patent application number 08/04429 of 4 Aug. 2008, entitled "Procédé de transmission pseudo-différentiel utilisant des variables électriques modales", corresponding to the international application number PCT/IB2009/052638 of 19 Jun. 2009, entitled "Method for pseudo-differential transmission using modal electrical variables", and the French patent application number 08/04430 of 4 Aug. 2008, entitled "Procédé transmission pseudo-différentiel utilisant des variables électriques naturelles", corresponding to the international application number PCT/IB2009/052645 of 19 Jun. 2009, entitled "Method for pseudo-differential transmission using natural electrical variables", describe pseudo-differential transmission devices which may be used to reduce echo, internal crosstalk and external crosstalk.

The FIG. 4 shows one of the pseudo-differential transmission devices disclosed in said French patent applications number 07/05260, 08/04429 or 08/04430, or the corresponding international applications. The pseudo-differential transmission device shown in FIG. 4 comprises an interconnection (1) having n=4 transmission conductors and a return conductor (10) distinct from the reference conductor (7), that is to say the ground conductor. In FIG. 4, each end of the interconnection (1) is connected to a termination circuit (4) which is not connected to the reference conductor (7). Three damping circuits (8) are connected between the return conductor (10) and the reference conductor (7). The transmitting circuits (5) receive at their inputs the signals from the m=4 channels of the two sources (2), and are connected to the conductors of the interconnection (1). The receiving circuits (6) are connected to the conductors of the interconnection (1). The pseudo-differential transmission device provides m transmission channels, such that the signals of the m channels of a source (2) connected to a transmitting circuit (5) in the activated state are sent to the m channels of the destinations (3) without noticeable echo, internal crosstalk and external crosstalk.

Only two interconnection-ground structures are known to be compatible with the pseudo-differential transmission device shown in FIG. 4. These interconnection-ground structures are shown in FIG. 5 and FIG. 6, in the case n=4. The FIG. 5 shows a section, at a given curvilinear abscissa z, in a plane orthogonal to the direction of propagation of signals, of an interconnection-ground structure built in a printed circuit board. In this structure, the return conductor (10) is a copper area and the transmission conductors (11) (12) (13) (14) are traces which are clearly closer to the return conductor (10) than to the reference conductor (7). The FIG. 6 shows a section, at a given curvilinear abscissa z, in a plane orthogonal to the direction of propagation of signals, of another interconnection-ground structure built in a printed circuit board. In this structure, the return conductor (10) is made of two interconnected copper areas (101) (102), and the transmission conductors (11) (12) (13) (14) are traces which are clearly closer to the return conductor (10) than to the reference conductor (7).

Unfortunately, the interconnection-ground structures shown in FIG. 5 and FIG. 6 need at least three conducting layers if they are built in a printed circuit board, or three metallization levels if they are built in a monolithic integrated circuit. Consequently, for instance because of cost considerations, it is often not possible to use the interconnection-ground structures shown in FIG. 5 and FIG. 6. In such cases, it is not possible to implement any one of the pseudo-differential transmission devices disclosed in said French patent applications 07/05260, 08/04429 or 08/04430, or the corresponding international applications.

DESCRIPTION OF THE INVENTION

The purpose of the invention is the transmission through an interconnection having two or more transmission conductors, the transmission being well protected against external crosstalk, internal crosstalk and echo, the interconnection-ground structure used being advantageous compared to the interconnection-ground structures shown in the FIGS. 2, 3, 5 and 6.

The invention is about a device for transmission providing, in a known frequency band, m transmission channels each corresponding to a signal to be sent from the input of at least one transmitting circuit to the output of at least one receiving circuit, where m is an integer greater than or equal to 2, the device for transmission comprising:

an interconnection comprising n transmission conductors numbered from 1 to n, the interconnection comprising r elementary return conductors numbered from 1 to r, n being an integer greater than or equal to m and r being an integer greater than or equal to 3, the interconnection being structurally combined with one or more elementary reference conductors throughout the length of the interconnection, the interconnection being such that, at a given point along the interconnection (or, equivalently: at a given curvilinear abscissa $z_0$ along the interconnection), in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the shortest distance between the transmission conductor number j and any other transmission conductor of the interconnection and less than the distance between the elementary return conductor number j and the elementary return conductor number j+1;

at least one said transmitting circuit receiving m "input signals of the transmitting circuit" corresponding each to a transmission channel, the output of said at least one said transmitting circuit being coupled to the n transmission conductors;

at least one said receiving circuit delivering, when said at least one said receiving circuit is in the activated state, m "output signals of the receiving circuit" corresponding each to a transmission channel, said at least one said receiving circuit comprising n signal terminals, a common terminal and a reference terminal (ground terminal), each of said signal terminals being coupled to one and only one of said transmission conductors, said common terminal being coupled to each of said elementary return conductors, said reference terminal being connected to each of said elementary reference conductors, each of said "output signals of the receiving circuit" being mainly determined by one or more of the voltages between one of said signal terminals and said common terminal.

In the following, the wordings "is in the deactivated state" and "is not in the activated state" are equivalent. According to the invention, it is possible that there is a deactivated state for one or more of said receiving circuits, in which the behavior of this receiving circuit is different from the one defined above. However, the existence of a deactivated state for one or more of said receiving circuits is not at all a characteristic of the invention.

According to the invention, said "input signals of the transmitting circuit" may be analog signals or digital signals. According to the invention, said "output signals of the receiving circuit" may be analog signals or digital signals.

According to the invention, said interconnection is structurally combined with one or more elementary reference conductors, throughout the length of the interconnection. Consequently, if said interconnection is made with a printed circuit board, the elementary reference conductors may be conductors of the printed circuit board, these conductors being not a part of said interconnection. Consequently, if said interconnection is made with a cable, the elementary reference conductors may be conductors of the cable, but the elementary reference conductors are nevertheless not a part of said interconnection.

According to the invention, r may be an integer greater than or equal to n−1, because in this case a screening effect may reduce the coupling between all transmission conductors. In particular, r may be equal to n+1.

In particular, said interconnection may be realized without using a cable, for instance an interconnection formed in or on a rigid or flexible printed circuit board (using traces and/or copper areas), or an interconnection formed in or on the substrate of a multi-chip module (MCM) or of an hybrid circuit, or an interconnection formed inside a monolithic integrated circuit.

In the above definition of the invention, the distance between a conductor A and a conductor B is considered in a section of the interconnection and of the elementary reference conductors in a plane orthogonal to the direction of propagation of signals (in the interconnection), so that this distance is the shortest distance between any point of the intersection of this plane with the conductor A and any point of the intersection of this plane with the conductor B. Consequently:

let us use $D_{TR\ 1j}(z)$ to denote the distance between the transmission conductor number j and the elementary return conductor number j, considered in the section, at the curvilinear abscissa z, of the interconnection and of the elementary reference conductors in the plane orthogonal to the direction of propagation of signals, that is to say the shortest distance between any point of the intersection of this plane with the transmission conductor number j and any point of the intersection of this plane with the elementary return conductor number j;

let us use $D_{TR\ 2j}(z)$ to denote the distance between the transmission conductor number j and the elementary return conductor number j+1, considered in the section, at the curvilinear abscissa z, of the interconnection and of the elementary reference conductors in the plane orthogonal to the direction of propagation of signals, that is to say the shortest distance between any point of the intersection of this plane with the transmission conductor number j and any point of the intersection of this plane with the elementary return conductor number j+1;

let us use $D_{TTj}(z)$ to denote the shortest distance between the transmission conductor number j and any other transmission conductor of the interconnection, considered in the section, at the curvilinear abscissa z, of the interconnection and of the elementary reference conductors in the plane orthogonal to the direction of propagation of signals, that is to say the shortest distance between any point of the intersection of this plane with the transmission conductor number j and any point of the intersection of this plane with all transmission conductors of the interconnection other than the transmission conductor number j; and let us use $D_{RRj}(z)$ to denote the distance between the elementary return conductor number j and the elementary return conductor number j+1, considered in the section, at the curvilinear abscissa z, of the interconnection and of the elementary reference conductors in the plane orthogonal to the direction of propagation of signals, that is to say the shortest distance between any point of the intersection of this plane with the elementary return conductor number j and any point of the intersection of this plane with the elementary return conductor number j+1.

According to the invention, for any integer j greater than or equal to 1, less than or equal to r−1 and less than or equal to n, the four following inequalities are satisfied:

$$D_{TR1j}(z_0) < D_{TTj}(z_0) \quad (1)$$

$$D_{TR2j}(z_0) < D_{TTj}(z_0) \quad (2)$$

$$D_{TR1j}(z_0) < D_{RRj}(z_0) \quad (3)$$

$$D_{TR2j}(z_0) < D_{RRj}(z_0) \quad (4)$$

In a device of the invention, the interconnection may be such that, at said given point along the interconnection (or, equivalently: at said given curvilinear abscissa $z_0$ along the interconnection), in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the shortest distance between the transmission conductor number j and any one of said elementary reference conductors. In this case, if we use $D_{TGj}(z)$ to denote the shortest distance between the transmission conductor number j and any one of the elementary reference conductors, considered in the section, at the curvilinear abscissa z, of the interconnection and of the elementary reference conductors in the plane orthogonal to the direction of propagation of signals, that is to say the shortest distance between any point of the intersection of this plane with the transmission conductor number j and any point of the intersection of this plane with all elementary reference conductors, we may say that, for any integer j greater than or equal to 1, less than or equal to r−1 and less than or equal to n, we have:

$$D_{TR1j}(z_0) < D_{TGj}(z_0) \quad (5)$$

$$D_{TR2j}(z_0) < D_{TGj}(z_0) \quad (6)$$

It is possible to show that the inequalities (1) to (6) are such that the electric field and the magnetic field associated with the signals may, to some extent, remain confined between the transmission conductors and the elementary return conductors.

In a device for transmission of the invention, the interconnection may be such that, over at least 9/10 of the length of the interconnection, in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the half of the shortest distance between the transmission conductor number j and any other transmission conductor of the interconnection, less than the half of the distance between the elementary return conductor number j and the elementary return conductor number j+1, and less than the half of the shortest distance between the transmission conductor number j and any one of said elementary reference conductors. In other words, if the interconnection extends from the curvilinear abscissa z=0 to the curvilinear abscissa z=L, the previous sentence means that there exists a union, denoted by U, of a finite number of disjoint closed intervals, each one of said closed intervals being included in [0, L], the sum of the lengths of said closed intervals being greater than or equal to 9/10 times L, U being such that, for any z∈U and for any integer j greater than or equal to 1, less than or equal to r−1 and less than or equal to n, we have $$D_{TR1j}(z) < \frac{1}{2} D_{TTj}(z) \quad (7)$$

$$D_{TR2j}(z) < \frac{1}{2} D_{TTj}(z) \quad (8)$$

$$D_{TR1j}(z) < \frac{1}{2} D_{RRj}(z) \quad (9)$$

$$D_{TR2j}(z) < \frac{1}{2} D_{RRj}(z) \quad (10)$$

$$D_{TR1j}(z) < \frac{1}{2} D_{TGj}(z) \quad (11)$$

$$D_{TR2j}(z) < \frac{1}{2} D_{TGj}(z) \quad (12)$$

It is possible to show that the inequalities (7) to (12) are such that, over at least 90% of the length of the interconnection, the electric field and the magnetic field associated with the signals may, to some extent, remain well confined between the transmission conductors and the elementary return conductors. In this case, because of the proximity effect, a significant part of the return current caused by the propagation of signals in the transmission conductors may flow in the elementary return conductors. This characteristic may be used to obtain a reduction of external crosstalk, because a significant part of this return current flows neither in the elementary reference conductors nor in other ground conductors. The interconnection-ground structures used in the first and third embodiments need only two conducting layers if they are built in a printed circuit board, or two metallization levels if they are built in a monolithic integrated circuit. The interconnection-ground structure used in the second embodiment needs only one conducting layer if it is built in a printed circuit board, or one metallization level if it is built in a monolithic integrated circuit. Consequently, the invention overcomes the limitations of prior-art pseudo-differential transmission devices.

A device of the invention may comprise a termination circuit having n signal nodes, each of said signal nodes being coupled to one and only one of said transmission conductors, each of said transmission conductors being coupled to one and only one of said signal nodes, said termination circuit having a common node connected to each of said elementary return conductors, said termination circuit being, when said termination circuit is in the activated state, approximately equivalent, for said signal nodes and said common node, to a (n+1)-terminal network such that, at least one quiescent operating point, for small signals in a part of said known frequency band, the impedance matrix, with respect to said common node, of said (n+1)-terminal network is equal to a wanted matrix of size n×n. The inequalities (7) to (12) are such that such a floating termination circuit may be proportioned to obtain reduced reflections, so that echo is reduced. This type of termination circuit is preferred because it does not produce return currents flowing mainly in the elementary reference conductors, in another ground conductor or in a power supply conductor.

However, a device of the invention may comprise a termination circuit having n signal nodes, each of said signal nodes being coupled to one and only one of said transmission conductors, each of said transmission conductors being coupled to one and only one of said signal nodes, said termination circuit having a common node connected to each of said elementary return conductors, said termination circuit having a ground node connected to each of said elementary reference conductors, said termination circuit being, when said termination circuit is in the activated state, approximately equivalent, for said signal nodes, said common node and said ground node, to a (n+2)-terminal network such that, at least one quiescent operating point, for small signals in a part of said known frequency band, the impedance matrix, with respect to said ground node, of said (n+2)-terminal network is equal to a wanted matrix of size (n+1)×(n+1). Such a non-floating termination circuit may also often be proportioned to obtain reduced reflections, so that echo is reduced.

According to the invention, it is possible that there is a deactivated state for one or more of said termination circuits, in which the behavior of this termination circuit is different from the behaviors defined above. However, the existence of a deactivated state for one or more of said termination circuits is not at all a characteristic of the invention.

A device of the invention may be such that at least one said termination circuit is made of a network of resistors. A termination circuit made of a network of resistors is however not at all a characteristic of the invention. By way of a first example, designers may, in order to reduce the power consumed by one of said termination circuits, choose to allow this termination circuit to be effective only in a relevant interval of frequencies, for instance by including suitable reactive circuit elements in this termination circuit. By way of a second example, one of said termination circuits could include active components, for instance insulated gate field-effect transistors (MOSFETs) operating in the ohmic regime. The impedance of the channel of such components may be adjustable by electrical means. Consequently, a device of the invention may be such that an impedance matrix of at least one said termination circuit in the activated state can be adjusted by electrical means.

In the case where one of said termination circuits has an activated state and a deactivated state, the impedance of the channel of one or more MOSFETs may for instance be controlled by one or more control signals taking on different values in the activated state and in the deactivated state. Consequently, at least one of said termination circuits may be such that said termination circuit has an activated state and a deactivated state, an impedance matrix of said termination circuit taking on, in the activated state, a value different from the value of this impedance matrix when said termination circuit is in the deactivated state.

In the case where one of said termination circuits has an activated state and a deactivated state, components such as transistors may for instance be used as switches having a closed state and an open state. In this case, said transistors may for instance be in the closed state when this termination circuit is in the activated state, and be in the open state when this termination circuit is in the deactivated state. Consequently, it is possible that at least one said termination circuit has an activated state and a deactivated state, each current flowing from said at least one said termination circuit to one of said transmission conductors being substantially zero when said at least one said termination circuit is in the deactivated state. Designers may, in order to reduce the power consumed by such a termination circuit, choose to put this termination circuit in the deactivated state when a transmitting circuit close to the termination circuit is in the activated state.

A device of the invention may further comprise at least one damping circuit, said at least one damping circuit having a common node connected to each of said elementary return conductors, said at least one damping circuit having a ground node connected to each of said elementary reference conductors, said at least one damping circuit being, for said common node and said ground node, approximately equivalent to a network consisting of a passive two-terminal circuit element connected in series with a voltage source delivering a constant voltage, said network having a first terminal coupled to said common node, said network having a second terminal coupled to said ground node. The specialist understands that said damping circuits are intended to provide a damping of the resonances of the circuit consisting of the elementary return conductors and the elementary reference conductors, which may be excited by the noise produced by unwanted electromagnetic couplings. Said damping circuits may therefore further reduce the effects of unwanted electromagnetic couplings.

According to the invention, one or more of said transmitting circuits and/or one or more of said receiving circuits may have a filtering function, for instance for the purpose of obtaining a pre-emphasis, a de-emphasis or an equalization improving transmission. It then becomes necessary to synthesize the corresponding filters, either as analog filters or as digital filters, using one of the many methods known to specialists.

When losses are not negligible in the interconnection, phase and amplitude distortions may occur, which are referred to as distortions caused by propagation. The reduction of these distortions may be obtained, in a device of the invention, using an equalization reducing the effects of the distortions caused by propagation, said equalization being implemented in one or more of said transmitting circuits and/or in one or more of said receiving circuits. This type of processing, which is also sometimes referred to as compensation, is well known to specialists, and may be implemented using analog signal processing or digital signal processing.

Specialists know that it is commonplace to use adaptive algorithms for implementing this type of processing in receivers for data transmission. A device of the invention may use an adaptive equalization. This type of processing is well known to specialists, and is often implemented using digital signal processing.

BRIEF DESCRIPTION OF THE DRAWINGS

Other advantages and characteristics of the invention will appear more clearly from the following description of particular embodiments of the invention, given by way of non-limiting examples, with reference to the accompanying drawings in which.

DETAILED DESCRIPTION OF SOME EMBODIMENTS

First Embodiment (Best Mode).

Figure 1:
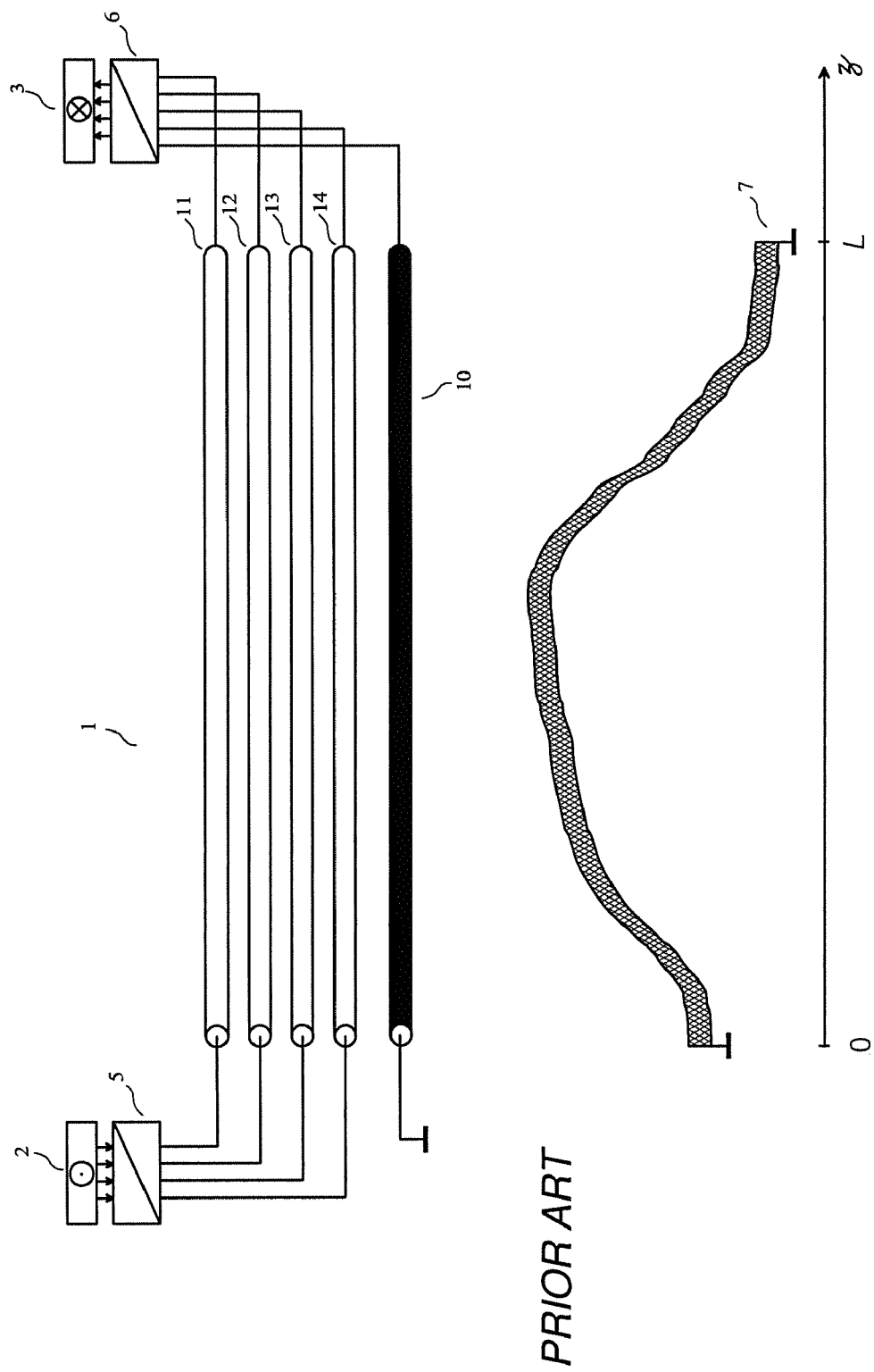
FIG. 1 shows a first prior art pseudo-differential transmission device comprising an interconnection having four transmission conductors, and has already been discussed in the section dedicated to the presentation of prior art.
Figure 2:
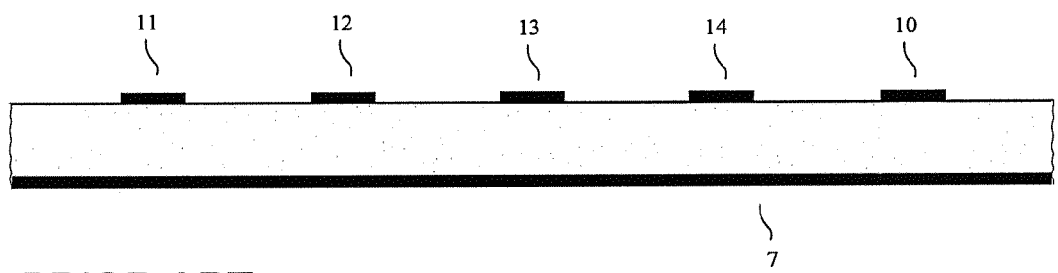
FIG. 2 shows a cross section of an interconnection and of the reference conductor, which may be used in the pseudo-differential transmission device shown in FIG. 1, and has already been discussed in the section dedicated to the presentation of prior art.
Figure 3:
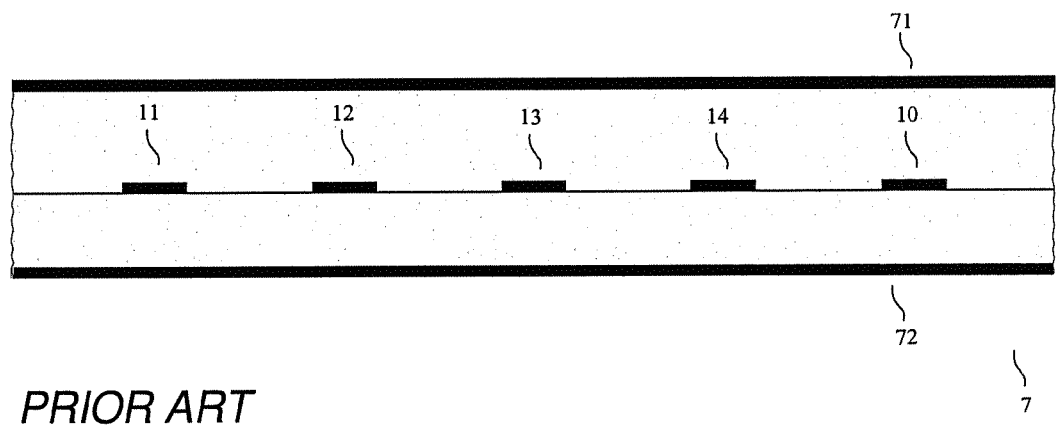
FIG. 3 shows a cross section of an interconnection and of the reference conductor, which may be used in the pseudo-differential transmission device shown in FIG. 1, and has already been discussed in the section dedicated to the presentation of prior art.
Figure 4:
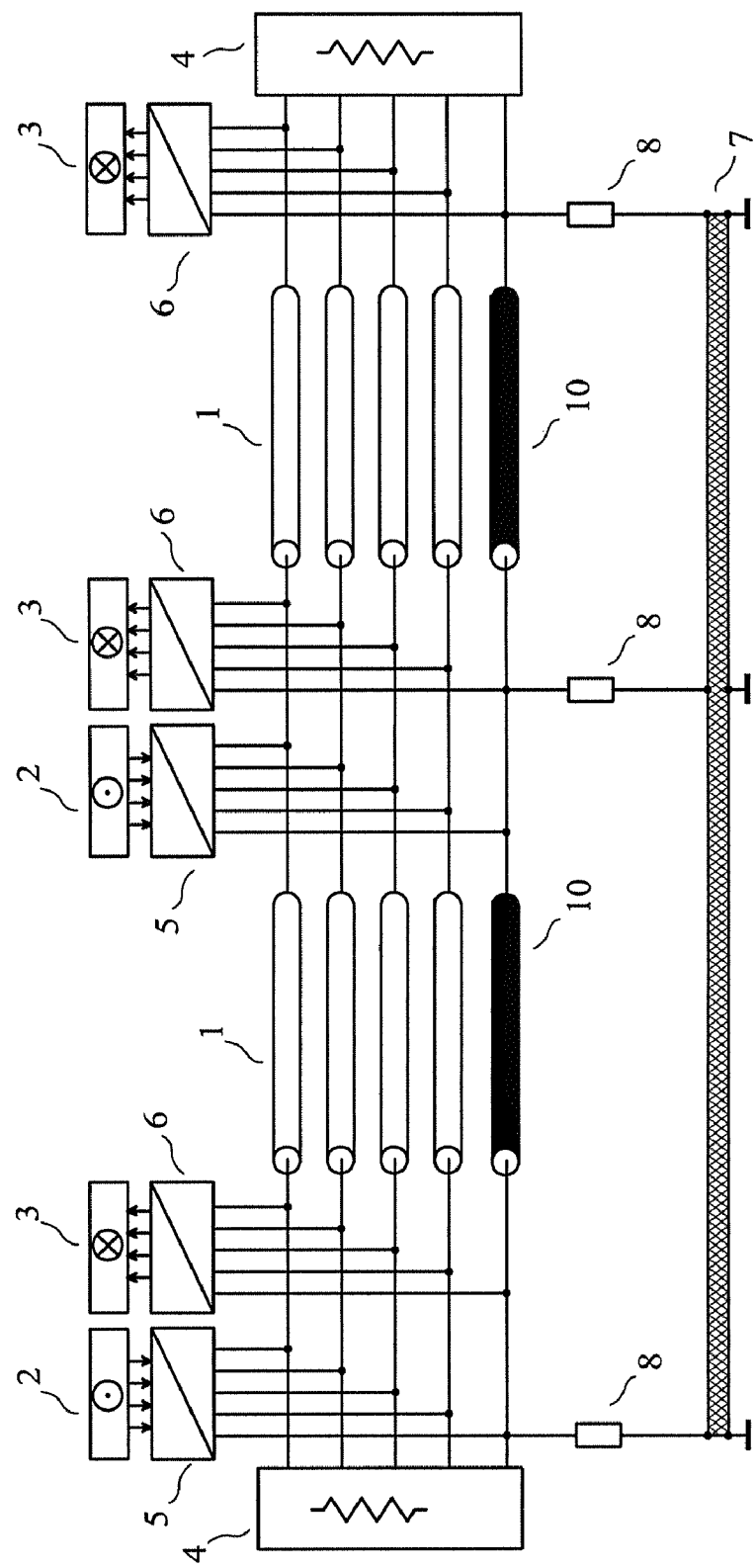
FIG. 4 shows a second prior art pseudo-differential transmission device comprising an interconnection having four transmission conductors, and has already been discussed in the section dedicated to the presentation of prior art.
Figure 5:
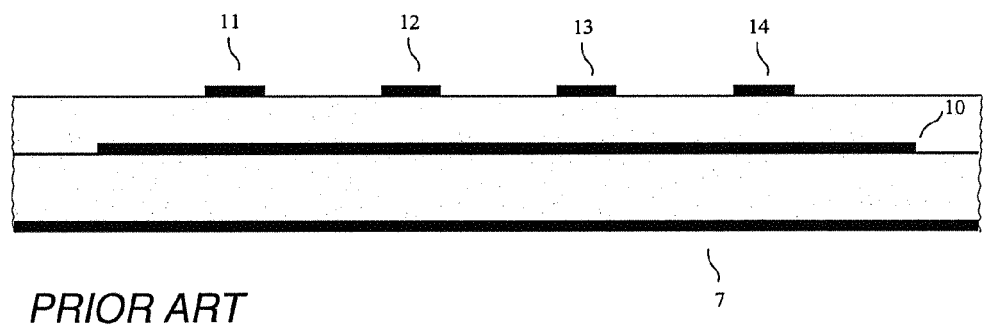
FIG. 5 shows a cross section of an interconnection and of the reference conductor, which may be used in the pseudo-differential transmission device shown in FIG. 4, and has already been discussed in the section dedicated to the presentation of prior art.
Figure 6:
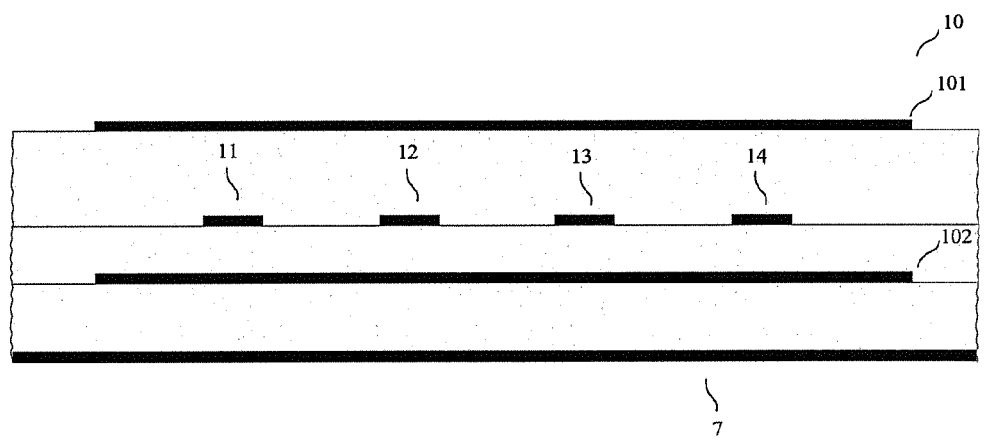
FIG. 6 shows a cross section of an interconnection and of the reference conductor, which may be used in the pseudo-differential transmission device shown in FIG. 4, and has already been discussed in the section dedicated to the presentation of prior art.
Figure 7:
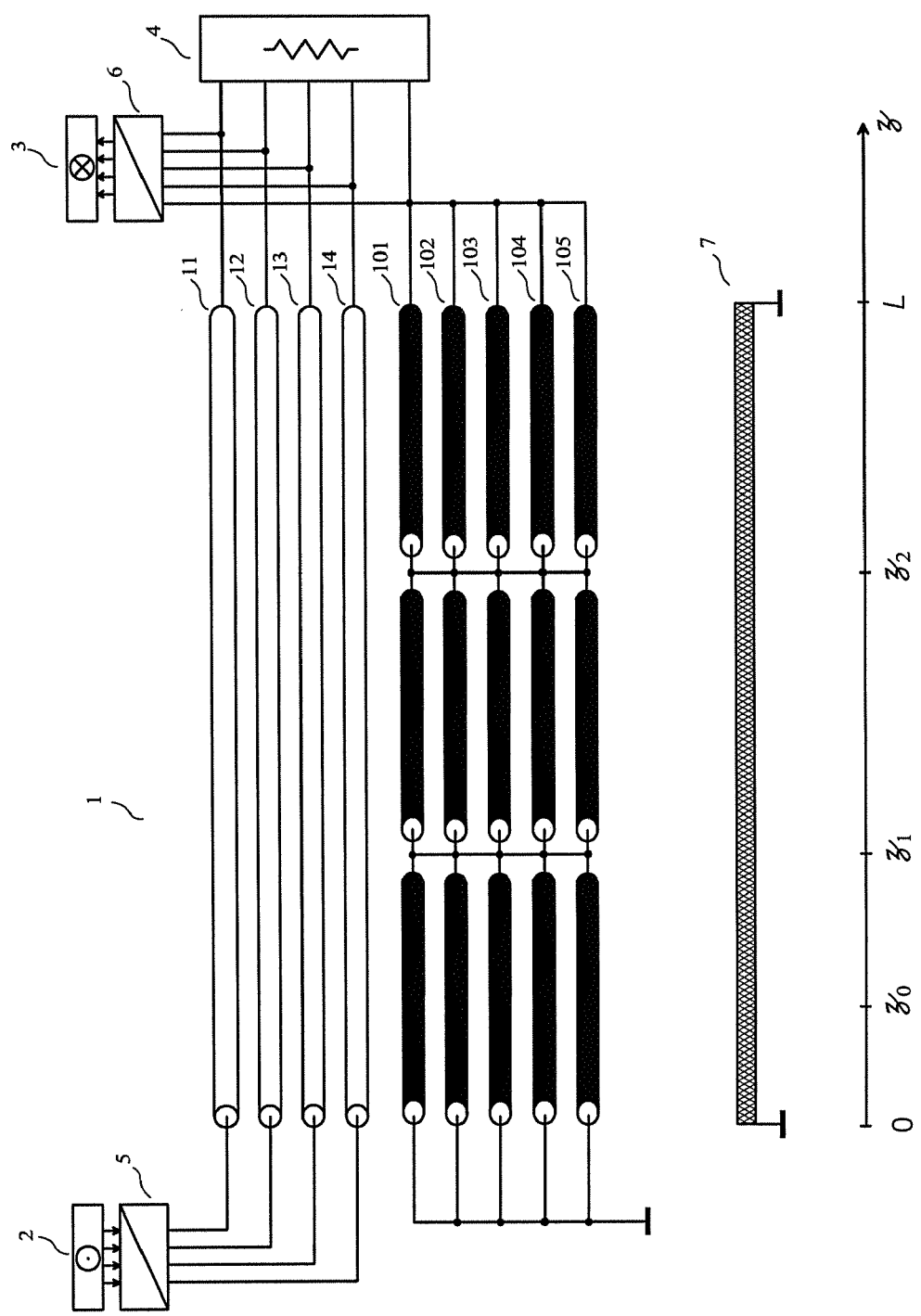
FIG. 7 shows a first embodiment of the invention.

As a first embodiment of a device for transmission of the invention, given by way of non-limiting example and best mode of carrying out the invention, we have represented in FIG. 7 a device of the invention comprising an interconnection (1) built in a printed circuit board, the interconnection (1) having n=4 transmission conductors (11) (12) (13) (14) and r=n+1 elementary return conductors (101) (102) (103) (104) (105). In this first embodiment, the reference conductor (7) comprises a single elementary reference conductor. All items shown in FIG. 7 belong to the same printed circuit assembly and the reference conductor (7) is a ground plane of the printed circuit board of said printed circuit assembly.

A transmitting circuit (5) receives at its input the m=4 "input signals of the transmitting circuit" from the m channels of the source (2), and its n output terminals are connected to the n transmission conductors (11) (12) (13) (14) of the interconnection (1), at the near-end of the interconnection (1). A termination circuit (4) is connected to the n+r conductors (101) (102) (103) (104) (105) (11) (12) (13) (14) of the interconnection (1), at the far-end of the interconnection (1). A receiving circuit (6) has its n+1 input terminals connected to the n+r conductors (101) (102) (103) (104) (105) (11) (12) (13) (14) of the interconnection (1), at the far-end of the interconnection (1). More precisely, the receiving circuit (6) has n signal terminals, a common terminal and a reference terminal (ground terminal), each of said signal terminals being coupled to one and only one of said transmission conductors (11) (12) (13) (14), said common terminal being coupled to each of said elementary return conductors (101) (102) (103) (104) (105), said reference terminal (which is not shown in FIG. 7) being connected to said reference conductor (7). The receiving circuit (6) delivers m "output signals of the receiving circuit" to the destination (3). Each of said "output signals of the receiving circuit" corresponds to a transmission channel and is mainly determined by one and only one of the voltages between one of said signal terminals and said common terminal. Thus, the analog or digital signals of the m channels of the source (2) are sent to the m channels of the destination (3).

Figure 8:
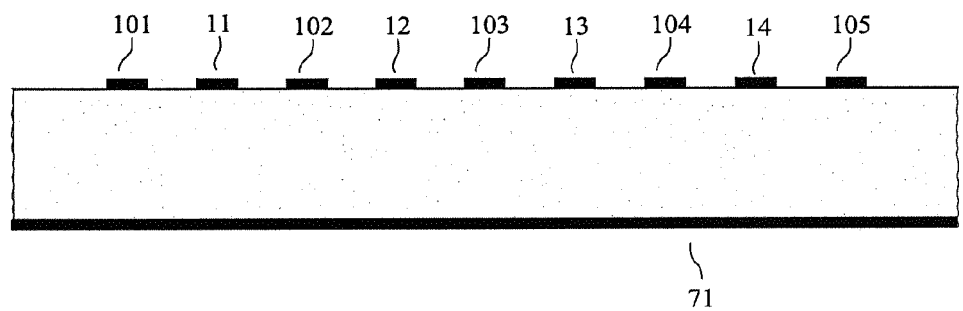
FIG. 8 shows a cross section of an interconnection and of the elementary reference conductors, which may be used in the pseudo-differential transmission device shown in FIG. 7.
Figure 9:
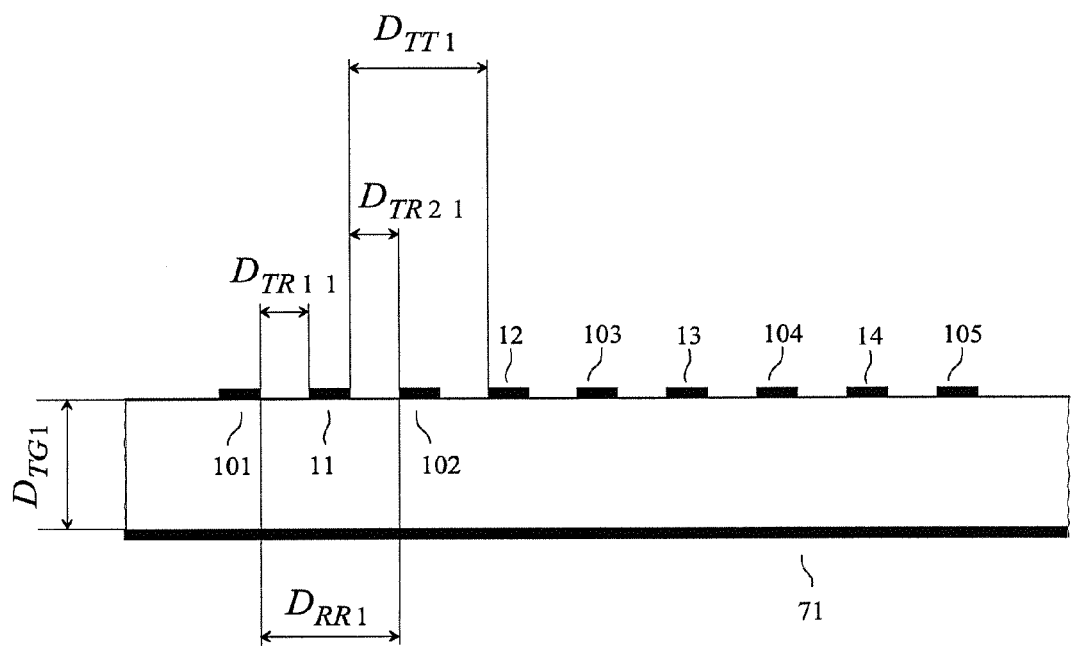
FIG. 9 shows the geometrical parameters of the drawing of FIG. 8.

The FIG. 8 shows a section, denoted by $S(z_0)$, at a given curvilinear abscissa $z_0$ shown in FIG. 7, in a plane orthogonal to the direction of propagation of signals, of the interconnection and of the elementary reference conductor (71). In this interconnection-ground structure, all conductors (101) (102) (103) (104) (105) (11) (12) (13) (14) of the interconnection are traces built in only one conducting layer of the printed circuit board, and the elementary reference conductor (71) is said ground plane of the printed circuit board of said printed circuit assembly. Each one of the transmission conductors (11) (12) (13) (14) is closer to the nearest of the elementary return conductors (101) (102) (103) (104) (105) than to the elementary reference conductor (71). More precisely, for any integer j greater than or equal to 1 and less than or equal to r−1=4 and to n=4, we may consider the distances $D_{TR\ 1j}(z_0)$, $D_{TR\ 2j}(z_0)$, $D_{TTj}(z_0)$, $D_{RRj}(z_0)$ and $D_{TGj}(z_0)$ defined above. For instance, for j=1, FIG. 9 shows:

the distance $D_{TR\ 11} = D_{TR\ 11}(z_0)$ between the transmission conductor number 1 (11) and the elementary return conductor number 1 (101), considered in $S(z_0)$;

the distance $D_{TR\ 21} = D_{TR\ 21}(z_0)$ between the transmission conductor number 1 (11) and the elementary return conductor number 2 (102), considered in $S(z_0)$;

the shortest distance $D_{TT\ 1} = D_{TT\ 1}(z_0)$ between the transmission conductor number 1 (11) and any other transmission conductor (12) (13) (14) of the interconnection, considered in $S(z_0)$;

the distance $D_{RR\ 1} = D_{RR\ 1}(z_0)$ between the elementary return conductor number 1 (101) and the elementary return conductor number 2 (102), considered in $S(z_0)$;

the distance $D_{TG\ 1} = D_{TG\ 1}(z_0)$ between the transmission conductor number 1 (11) and the elementary reference conductor (71), considered in $S(z_0)$.

The interconnection-ground structure is such that the inequalities (1) to (6) are satisfied. Consequently, at the curvilinear abscissa $z_0$ along the interconnection, in a section of the interconnection and of the elementary reference conductors in a plane orthogonal to the direction of propagation of signals, for any integer j greater than or equal to 1 and less than or equal to r−1 and to n, the distance between the transmission conductor number j and the elementary return conductor number j and the distance between the transmission conductor number j and the elementary return conductor number j+1 are both less than the shortest distance between the transmission conductor number j and any other transmission conductor of the interconnection, less than the distance between the elementary return conductor number j and the elementary return conductor number j+1, and less than the shortest distance between the transmission conductor number j and any one of said elementary reference conductors.

Moreover, the interconnection (1) extending from the curvilinear abscissa z=0 to the curvilinear abscissa z=L, there exists a subset U of [0, L], U corresponding to at least 9/10 of the length of the interconnection (1), $z_0$ being an element of U and U being such that, for any z lying in U, the inequalities (7) to (12) are satisfied.

The FIG. 7 shows that, in this first embodiment, the elementary return conductors (101) (102) (103) (104) (105) are interconnected at z=0, where they are grounded, at z=L, where they are connected to the common terminal of the receiving circuit (6), and at two other curvilinear abscissae $z_1$ and $z_2$ along the interconnection. The specialist understands that increasing the number of curvilinear abscissae at which the elementary return conductors (101) (102) (103) (104) (105) are interconnected increases the frequency up to which the elementary return conductors (101) (102) (103) (104) (105) may behave as a single conductor. The specialist understands that the interconnection-ground structure shown in FIG. 8 may be modeled as a (n+2)-conductor multiconductor transmission line below this frequency, whereas it must be modeled as a (2n+2)-conductor multiconductor transmission line above this frequency. Consequently, this interconnection-ground structure cannot be used in one of the pseudo-differential transmission devices disclosed in said French patent applications 07/05260, 08/04429 or 08/04430 or the corresponding international applications.

In this first embodiment, the transmitting circuit (5) delivers n transmission variables, each of said transmission variables being a voltage between one of the transmission conductors (11) (12) (13) (14) and ground, each of these transmission variables being mainly determined by one and only one of said "input signals of the transmitting circuit". The termination circuit (4) is always is in the activated state, and is approximately equivalent, for the interconnection (1), to a linear (n+1)-terminal network such that, in a part of the known frequency band used for transmission, the impedance matrix of said (n+1)-terminal network, with respect to its common node connected to the elementary return conductors (101) (102) (103) (104) (105), is equal to a wanted diagonal matrix of size n×n. The receiving circuit (6) is always in the activated state. The termination circuit (4) and the receiving circuit (6) form an interfacing device disclosed in the French patent application number 07/04421 of 21 Jun. 2007, entitled "Dispositif d'interface pseudo-différentiel avec circuit de terminaison" and the corresponding international application number PCT/IB2008/051826 of 8 May 2008 (WO 2008/155676), entitled "Pseudo-differential interfacing device having a termination circuit".

The specialist understands that, in this embodiment:
a) the fact that the common terminal of the receiving circuit (6) is connected to elementary return conductors (101) (102) (103) (104) (105) which are distinct from the reference conductor corresponds to a pseudo-differential transmission scheme providing a reduction of external crosstalk;
b) the elementary return conductors (101) (102) (103) (104) (105) provide some shielding between the transmission conductors (11) (12) (13) (14), which reduces internal crosstalk;
c) the termination circuit (4), which may be proportioned to effectively reduce echo as explained above, does not degrade the external crosstalk since it is not connected to ground.

Consequently, the signals of the m channels of the source (2) are sent to the m channels of the destination (3) without noticeable echo, internal crosstalk and external crosstalk.

An interconnection-ground structure similar to the one shown in FIG. 8 could also be built inside a monolithic integrated circuit, and be used in a device of the invention similar to the first embodiment. In this case, all conductors of the interconnection may be built in only one metallization level of the integrated circuit chip.

Second Embodiment.

Figure 10:
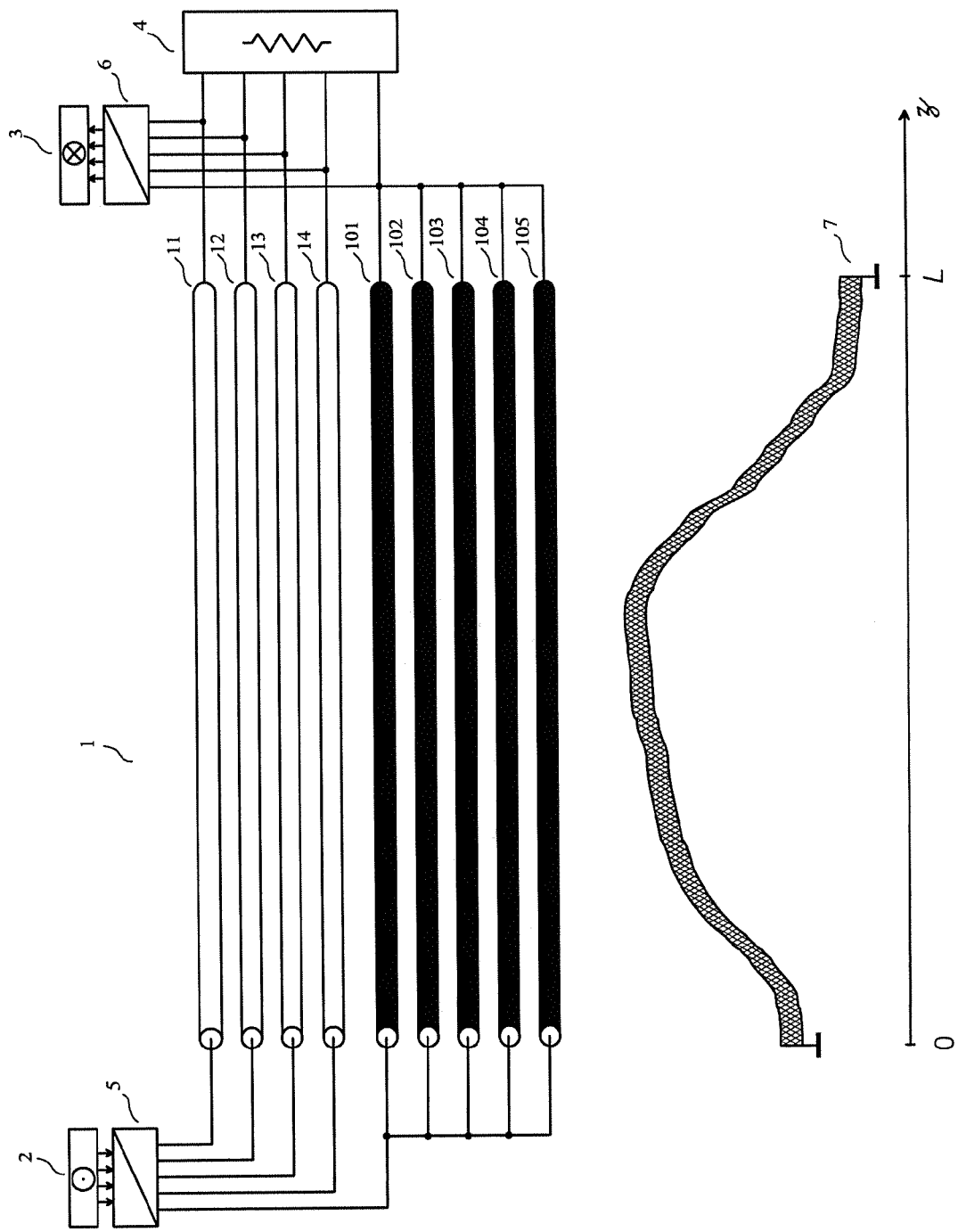
FIG. 10 shows a second embodiment of the invention.

As a second embodiment of a device for transmission of the invention, given by way of non-limiting example, we have represented in FIG. 10 a device of the invention comprising an interconnection (1) built in a flexible printed circuit board, the interconnection (1) having n=4 transmission conductors (11) (12) (13) (14) and r=n+1 elementary return conductors (101) (102) (103) (104) (105). In this second embodiment, the reference conductor (7) comprises two elementary reference conductors which are grounded, that is to say connected to a 0 V terminal of a rigid printed circuit board, at both ends of the interconnection (1), each grounding of both elementary reference conductors at a given curvilinear abscissa being, in FIG. 10, represented as a grounding of the reference conductor (7) at this given curvilinear abscissa.

A transmitting circuit (5) receives at its input the m=4 "input signals of the transmitting circuit" from the m channels of the source (2), and its n+1 output terminals are connected to the n+r conductors (101) (102) (103) (104) (105) (11) (12) (13) (14) of the interconnection (1), at the near-end of the interconnection (1). A termination circuit (4) is connected to the n+r conductors (101) (102) (103) (104) (105) (11) (12) (13) (14) of the interconnection (1), at the far-end of the interconnection (1). A receiving circuit (6) has its n+1 input terminals connected to the n+r conductors (101) (102) (103) (104) (105) (11) (12) (13) (14) of the interconnection (1), at the far-end of the interconnection (1). More precisely, the receiving circuit (6) has n signal terminals, a common terminal and a reference terminal (ground terminal), each of said signal terminals being coupled to one and only one of said transmission conductors (11) (12) (13) (14), said common terminal being coupled to each of said elementary return conductors (101) (102) (103) (104) (105), said reference terminal (which is not shown in FIG. 10) being connected to said elementary reference conductors. The receiving circuit (6) delivers m "output signals of the receiving circuit" to the destination (3). Each of said "output signals of the receiving circuit" corresponds to a transmission channel and is mainly determined by one or more of the voltages between one of said signal terminals and said common terminal. Thus, the analog or digital signals of the m channels of the source (2) are sent to the m channels of the destination (3).

Figure 11:
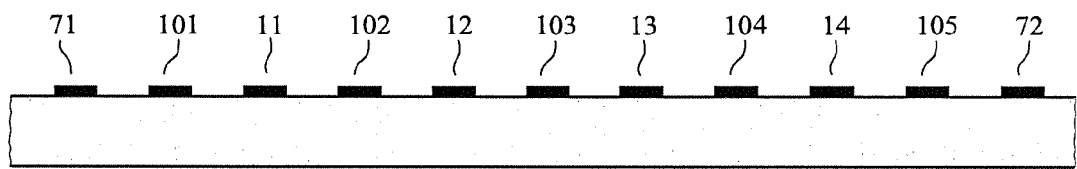
FIG. 11 shows a cross section of an interconnection and of the elementary reference conductors, which may be used in the pseudo-differential transmission device shown in FIG. 10.
Figure 12:
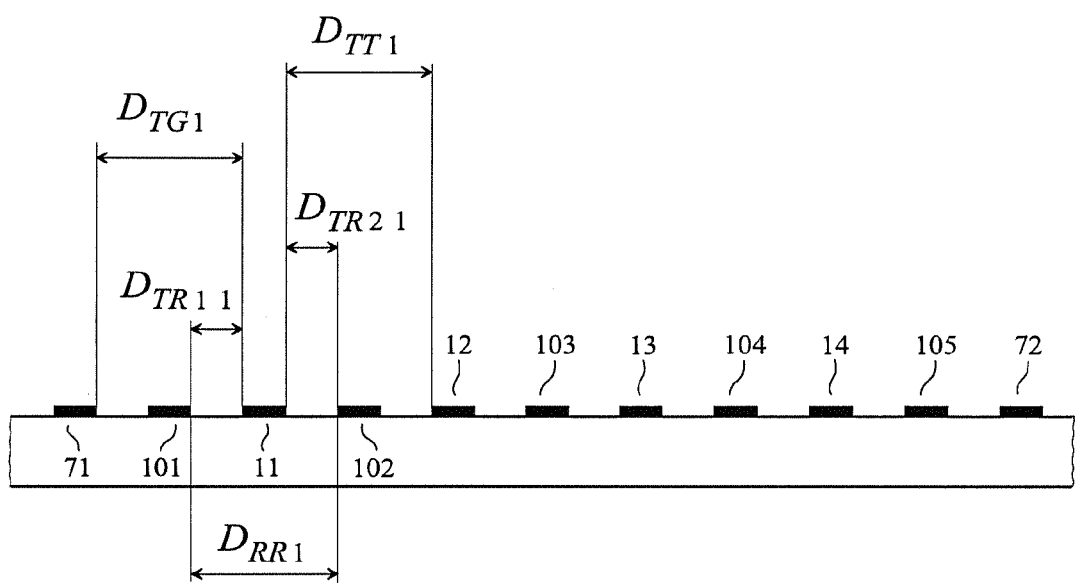
FIG. 12 shows the geometrical parameters of the drawing of FIG. 11.

The FIG. 11 shows a section, denoted by $S(z_0)$, at a given curvilinear abscissa $z_0$, in a plane orthogonal to the direction of propagation of signals, of the interconnection and of the elementary reference conductors (71) (72), when the flexible printed circuit board rests on a flat surface. In this interconnection-ground structure, all conductors (101) (102) (103) (104) (105) (11) (12) (13) (14) of the interconnection and the elementary reference conductors (71) (72) are traces built in only one conducting layer of the printed circuit board. Each one of the transmission conductors (11) (12) (13) (14) is closer to the nearest of the elementary return conductors (101) (102) (103) (104) (105) than to any one of the elementary reference conductors (71) (72). More precisely, for any integer j greater than or equal to 1 and less than or equal to r−1=4 and to n=4, we may consider the distances $D_{TR\,1j}(z_0)$, $D_{TR\,2j}(z_0)$, $D_{TTj}(z_0)$, $D_{RRj}(z_0)$ and $D_{TGj}(z_0)$ defined above. For instance, for j=1, FIG. 12 shows:

the distance $D_{TR\,11} = D_{TR\,11}(z_0)$ between the transmission conductor number 1 (11) and the elementary return conductor number 1 (101), considered in $S(z_0)$;

the distance $D_{TR\,21} = D_{TR\,21}(z_0)$ between the transmission conductor number 1 (11) and the elementary return conductor number 2 (102), considered in $S(z_0)$;

the shortest distance $D_{TT\,1} = D_{TT\,1}(z_0)$ between the transmission conductor number 1 (11) and any other transmission conductor (12) (13) (14) of the interconnection, considered in $S(z_0)$;

the distance $D_{RR\,1} = D_{RR\,1}(z_0)$ between the elementary return conductor number 1 (101) and the elementary return conductor number 2 (102), considered in $S(z_0)$;

the shortest distance $D_{TG\,1}=D_{TG\,1}(z_0)$ between the transmission conductor number 1 (11) and any one of the elementary reference conductors (71) (72), considered in $S(z_0)$.

The interconnection-ground structure is such that the inequalities (1) to (6) are satisfied. If the flexible printed circuit board is bended or twisted, the inequalities (1) to (6) are still satisfied for reasonable distortions, even though the centers, in a cross section of the interconnection, of each of the conductors (101) (102) (103) (104) (105) (11) (12) (13) (14) of the interconnection do not remain collinear, in general. Moreover, the interconnection (1) extending from the curvilinear abscissa z=0 to the curvilinear abscissa z=L, for any z lying in [0, L], the inequalities (7) to (12) are satisfied (for reasonable distortions).

The specialist understands that the elementary reference conductors (71) (72) are such that other ground conductors or conducting items near the interconnection-ground structure shown in FIG. 11 may influence the propagation characteristics of this interconnection-ground structure. Since such other ground conductors or conducting items could possibly also be considered as parts of the reference conductor (7) shown in FIG. 10, this reference conductor (7) is represented, in FIG. 10, as an irregular geometrical shape, such that the distance between the conductors of the interconnection (1) and the reference conductor (7) varies as a function of the curvilinear abscissa z along the interconnection.

In this second embodiment, the elementary return conductors (101) (102) (103) (104) (105) are interconnected at z=0, where they are connected to an output terminal of the transmitting circuit (5), and at z=L, where they are connected to the common terminal of the receiving circuit (6). The specialist understands that the interconnection-ground structure shown in FIG. 11 needs, above a certain frequency, to be modeled as a (2n+3)-conductor multiconductor transmission line or as a multiconductor transmission line having more than 2n+3 conductors if said other ground conductors or conducting items need to be taken into account.

In this second embodiment, the transmitting circuit (5) delivers n transmission variables, each of said transmission variables being a current flowing into one of the transmission conductors (11) (12) (13) (14), each of these transmission variables being mainly determined by one or more of said "input signals of the transmitting circuit", one or more of said transmission variables being not mainly determined by only one of said "input signals of the transmitting circuit". The transmitting circuit (5) is a device disclosed in the French patent application number 08/03985 of 11 Jul. 2008, entitled "Dispositif d'interface multicanal avec circuit d'équilibrage", corresponding to the international application number PCT/IB2009/051557 of 14 Apr. 2009, entitled "Multichannel interfacing device having a balancing circuit", having n signal terminals and a common terminal, each of said signal terminals being connected to one and only one of said transmission conductors (11) (12) (13) (14), each of said transmission conductors (11) (12) (13) (14) being connected to one and only one of said signal terminals, said common terminal being connected to each of said elementary return conductors (101) (102) (103) (104) (105).

The termination circuit (4) is always in the activated state and is approximately equivalent, for the interconnection (1), to a linear (n+1)-terminal network such that, in a part of the known frequency band used for transmission, the impedance matrix of said (n+1)-terminal network, with respect to its common node connected to the elementary return conductors (101) (102) (103) (104) (105), is equal to a wanted non-diagonal matrix of size n×n. The receiving circuit (6) is always in the activated state. The termination circuit (4) and the receiving circuit (6) form an interfacing device disclosed in the French patent application number 08/03876 of 8 Jul. 2008, entitled "Dispositif d'interface multicanal avec circuit de terminaison", corresponding to the international application number PCT/IB2009/051182 of 20 Mar. 2009, entitled "Multichannel interfacing device having a termination circuit".

An interconnection-ground structure similar to the one shown in FIG. 11 could also be built inside a monolithic integrated circuit, and be used in a device of the invention similar to the second embodiment.

Third Embodiment.

Figure 13:
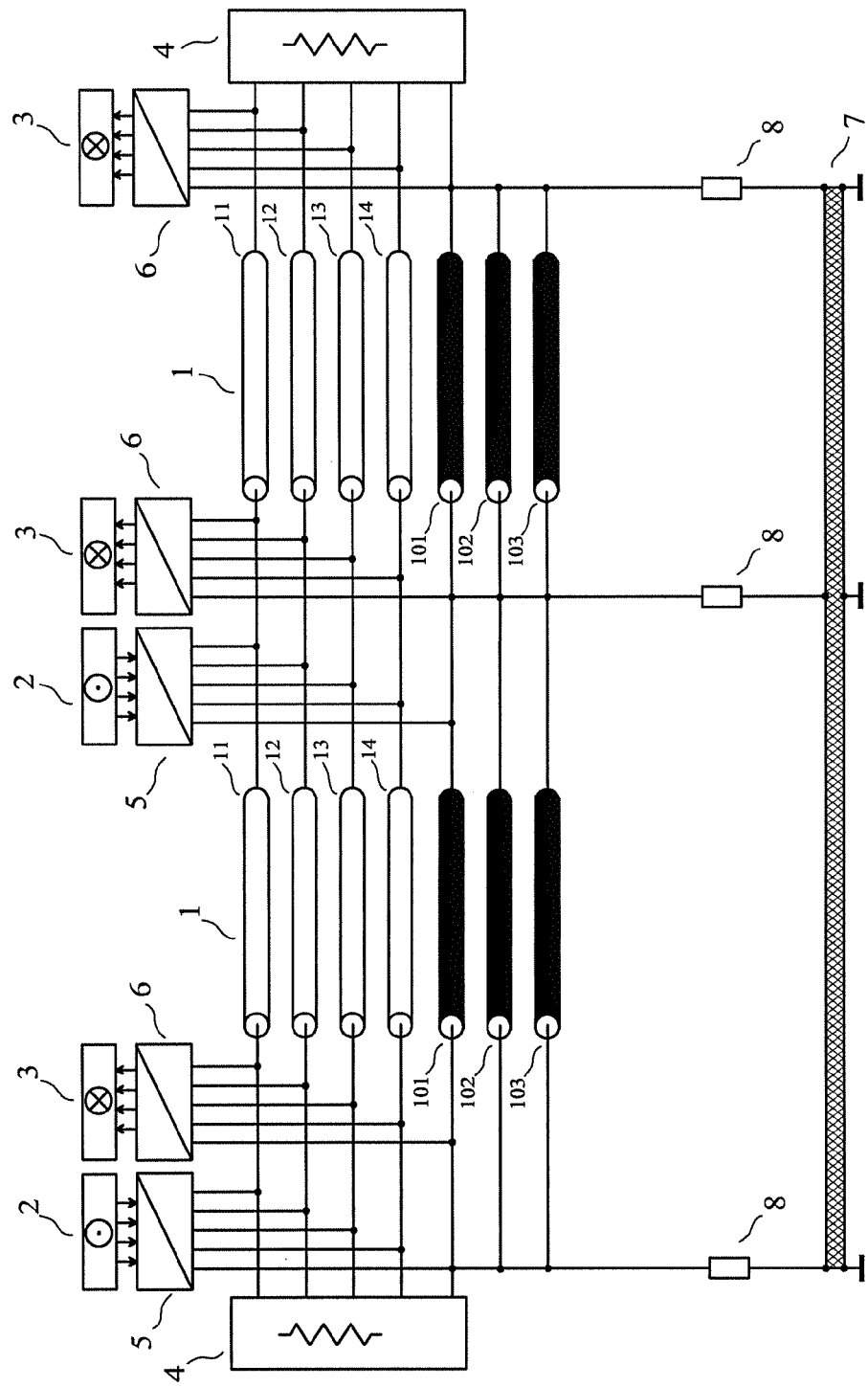
FIG. 13 shows a third embodiment of the invention.

As a third embodiment of a device for transmission of the invention, given by way of non-limiting example, we have represented in FIG. 13 a device of the invention comprising an interconnection (1) built in or on the substrate of a multi-chip module, the interconnection (1) having n=4 transmission conductors (11) (12) (13) (14) and r=n−1 elementary return conductors (101) (102) (103). In this third embodiment, the reference conductor (7) comprises a single elementary reference conductor which is grounded, that is to say connected to a 0 V terminal of a chip, at several points along the interconnection (1), each grounding of the elementary reference conductor being, in FIG. 13, represented as a grounding of the reference conductor (7). All items shown in FIG. 13 belong to the same multi-chip module.

At each end of the interconnection (1), a termination circuit (4) is connected to the n+r conductors (101) (102) (103) (11) (12) (13) (14) of the interconnection (1). Each termination circuit (4) is always in the activated state and is approximately equivalent, for the interconnection (1), to a linear (n+1)-terminal network such that, in the known frequency band used for transmission, the impedance matrix of said (n+1)-terminal network, with respect to its common node connected to the elementary return conductors (101) (102) (103), is equal to a wanted matrix of size n×n. Two transmitting circuits (5) placed at two different curvilinear abscissae, receive at their inputs the signals from the m=4 channels of two sources (2), and the n+1 output terminals of each transmitting circuit (5) are connected to the n+r conductors (101) (102) (103) (11) (12) (13) (14) of the interconnection (1). Three receiving circuits (6) are placed at three different curvilinear abscissae and the n+1 input terminals of each receiving circuit (6) are connected to the n+r conductors (101) (102) (103) (11) (12) (13) (14) of the interconnection (1). Three damping circuits (8) are connected between the elementary return conductors (101) (102) (103) and the reference conductor (7). The output of each of said receiving circuits (6) delivers, when said receiving circuit (6) is in the activated state, m "output signals of the receiving circuit" to a destination (3).

In FIG. 13, each of said transmitting circuits (5) is associated with a receiving circuit (6) placed at the same curvilinear abscissa z as said each of said transmitting circuits (5). Each of said transmitting circuits (5) delivers, when said each of said transmitting circuits (5) is in the activated state, n transmission variables, each of said transmission variables being a current flowing into one of the transmission conductors (11) (12) (13) (14), each of these transmission variables being mainly determined by the signals of one or more channels of the source (2) connected to said each of said transmitting circuits (5).

We note that FIG. 13 shows a data bus architecture, and that the address and/or control lines needed to obtain the activated state of at most one transmitting circuit (5) at a given point in time are not shown in FIG. 13.

We note that, in the device of FIG. 13, the transmitting circuits (5) and the receiving circuits (6) being connected in parallel with the interconnection (1), they may, in order not to disturb the propagation of waves along the interconnection in a detrimental way, and in order not to produce undesirable reflections at the ends of the interconnection, present high impedances to the interconnection. In the device of FIG. 13, two termination circuits (4) are necessary because waves coming from the interconnection (1) may be incident on both ends.

Figure 14:
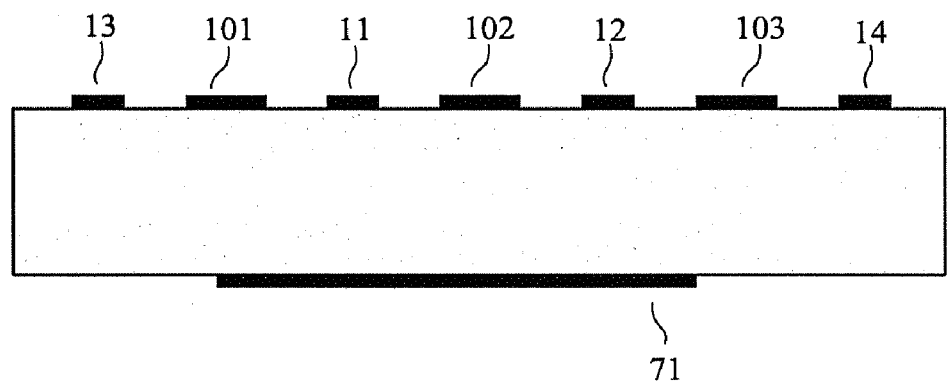
FIG. 14 shows a cross section of an interconnection and of the elementary reference conductors, which may be used in the pseudo-differential transmission device shown in FIG. 13.
Figure 15:
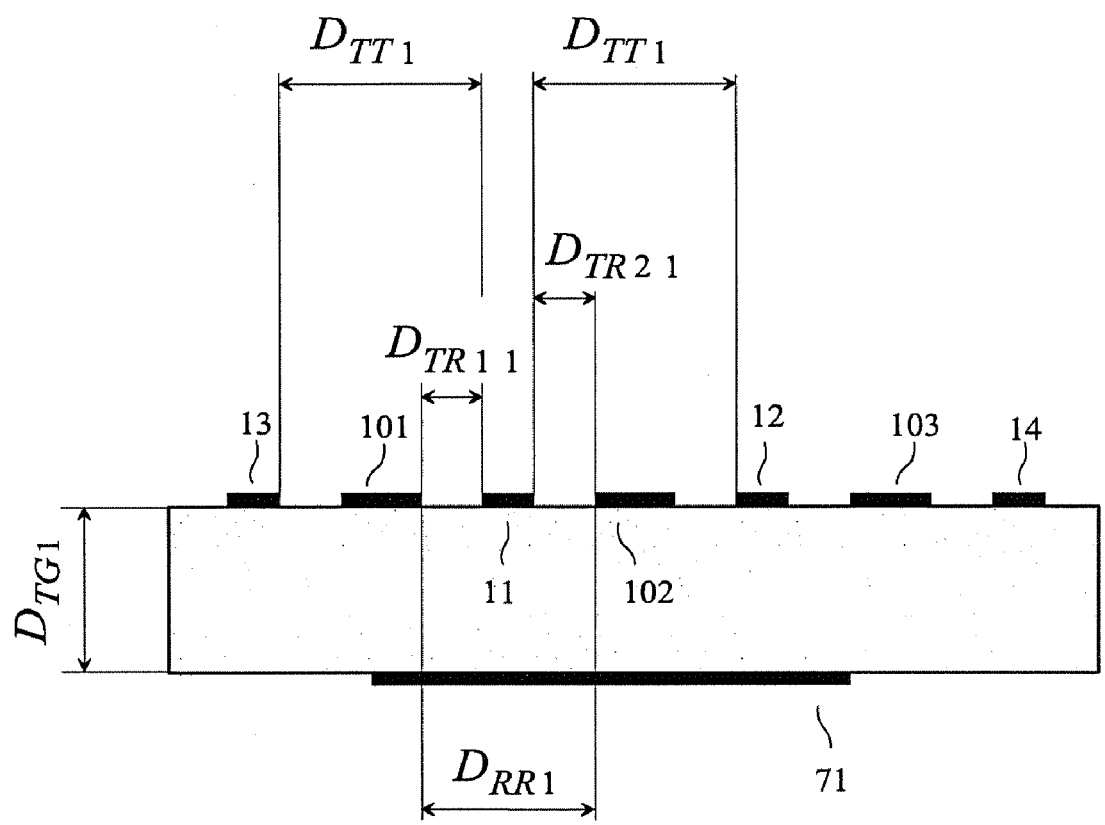
FIG. 15 shows the geometrical parameters of the drawing of FIG. 14.

The FIG. 14 shows a section, denoted by $S(z_0)$, at a given curvilinear abscissa $z_0$, in a plane orthogonal to the direction of propagation of signals, of the interconnection and of the elementary reference conductor (71). In this interconnection-ground structure, all conductors (101) (102) (103) (11) (12) (13) (14) of the interconnection are traces built in only one conducting layer of the substrate of the multi-chip module. For this interconnection-ground structure, in a section of the interconnection and of the elementary reference conductors in said plane orthogonal to the direction of propagation of signals in the interconnection, each one of the transmission conductors (11) (12) (13) (14) is closer to the nearest elementary return conductor (101) (102) (103) than to the nearest elementary reference conductor (71). Additionally, for any integer j greater than or equal to 1 and less than or equal to r−1=2 and to n=4, we may consider the distances $D_{TR\ 1j}(z_0)$, $D_{TR\ 2j}(z_0)$, $D_{TTj}(z_0)$, $D_{RRj}(z_0)$ and $D_{TGj}(z_0)$ defined above. For instance, for j=1, FIG. 15 shows:

- the distance $D_{TR\ 11}=D_{TR\ 11}(z_0)$ between the transmission conductor number 1 (11) and the elementary return conductor number 1 (101), considered in $S(z_0)$;
- the distance $D_{TR\ 21}=D_{TR\ 21}(z_0)$ between the transmission conductor number 1 (11) and the elementary return conductor number 2 (102), considered in $S(z_0)$;
- the shortest distance $D_{TT\ 1}=D_{TT\ 1}(z_0)$ between the transmission conductor number 1 (11) and any other transmission conductor (12) (13) (14) of the interconnection, considered in $S(z_0)$;
- the distance $D_{RR\ 1}=D_{RR\ 1}(z_0)$ between the elementary return conductor number 1 (101) and the elementary return conductor number 2 (102), considered in $S(z_0)$;
- the distance $D_{TG\ 1}=D_{TG\ 1}(z_0)$ between the transmission conductor number 1 (11) and the elementary reference conductor (71), considered in $S(z_0)$.

The interconnection-ground structure is such that the inequalities (1) to (6) are satisfied. In this third embodiment, FIG. 13 shows that the elementary return conductors (101) (102) (103) are interconnected at 3 curvilinear abscissae along the interconnection (1).

This third embodiment is intended for transmitting digital signals. In FIG. 13, the bus architecture uses a direct connection of the transmitting circuits (5) and of the receiving circuits (6) to the interconnection (1). This is not a characteristic of the invention. For instance, according to the invention, the transmitting circuits (5) and/or the receiving circuits (6) may be coupled to the interconnection (1) using one or more electromagnetic couplers. This type of coupling is for instance described in the patent of the U.S. Pat. No. 7,080,186 entitled "Electromagnetically-coupled bus system". This type of indirect coupling may provide a higher transmission bandwidth.

INDICATIONS ON INDUSTRIAL APPLICATIONS

The invention is suitable for pseudo-differential transmission between integrated circuits through an interconnection having two or more transmission conductors, the transmission presenting reduced echo, reduced internal crosstalk and reduced external crosstalk. The elementary return conductors being close to the transmission conductors, a specialist in electromagnetic compatibility understands that the invention also provides a reduced radiated emission (i.e., a reduced emission of radiated disturbances) and an increased radiated immunity (i.e., an increased immunity to radiated disturbances).

An important point is that the interconnection may use only one conductor layer if it is built in or on a printed circuit board or in or on the substrate of a multi-chip module, or only one metallization level if it is built in a monolithic integrated circuit. Such an interconnection may be very inexpensive.

We note that, in the embodiments of a device for transmission of the invention, given above by way of non-limiting examples, according to the FIGS. 8, 9, 11, 12, 14 and 15, each conductor of the interconnection and each elementary reference conductor have a rectangular cross section. This is not at all a characteristic of the invention: according to the invention, each conductor of the interconnection and each elementary reference conductor may have a non rectangular cross section.

We note that, in the embodiments of a device for transmission of the invention, given above by way of non-limiting examples, according to the FIGS. 8, 9, 11, 12, 14 and 15, the centers, in a cross section of the interconnection, of the conductors of the interconnection are collinear. This is not at all a characteristic of the invention: according to the invention, it is possible that, in a cross section of the interconnection, the centers of the conductors of the interconnection are not collinear.

The invention is suitable for the protection against the noise produced by unwanted electromagnetic couplings in printed circuit boards. The invention is particularly advantageous to printed circuit boards comprising wide-band analog circuits or fast digital circuits. For transmitting in m transmission channels, the invention has the advantage of only requiring m+1 pins on an integrated circuit providing the functions of a transmitting circuit and of a receiving circuit, as opposed to 2m pins in the case of a transceiver for differential transmission. Interconnection-ground structures similar to the ones shown in FIG. 8 or FIG. 11 are particularly useful for building high-performance low-cost flat flexible interconnections such as the interconnections used in the hinge of a portable radio telephone or of a portable computer.

The invention is suitable for the protection against the noise produced by unwanted electromagnetic couplings in flexible printed circuit boards, for instance the flexible printed circuit boards used as a link between a magnetic head of a hard disk drive and a rigid printed circuit board, or the flexible printed circuit boards used as a link between a flat panel display and a rigid printed circuit board.

The invention is particularly suitable for pseudo-differential transmission inside an integrated circuit, because it provides a good protection against the noise related to the currents flowing in the reference conductor and in the substrate of the integrated circuit.

The invention is suitable for an implementation in a data bus architecture.

The invention is particularly suitable for multilevel signaling, because this type of transmission scheme is more sensitive to noise than binary signaling.

The invention is particularly suitable for simultaneous bi-directional signaling, because this type of transmission scheme is more sensitive to noise than unidirectional signaling.

The invention claimed is:

1. A device for transmission providing, in a known frequency band, m transmission channels each corresponding to a signal to be sent from the input of at least one transmitting circuit to the output of at least one receiving circuit, where m is an integer greater than or equal to 2, the device for transmission comprising:
   an interconnection comprising n transmission conductors numbered from 1 to n, the interconnection comprising r elementary return conductors numbered from 1 to r, n being an integer greater than or equal to m and r being an integer greater than or equal to 3, the interconnection being structurally combined with one or more elementary reference conductors throughout the length of the interconnection, the interconnection being such that, at a given point along the interconnection, in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the shortest distance between the transmission conductor number j and any other transmission conductor of the interconnection and less than the distance between the elementary return conductor number j and the elementary return conductor number j+1;
   at least one said transmitting circuit receiving m input signals of the transmitting circuit corresponding each to a transmission channel, the output of said at least one said transmitting circuit being coupled to the n transmission conductors;
   at least one said receiving circuit delivering, when said at least one said receiving circuit is in the activated state, m output signals of the receiving circuit corresponding each to a transmission channel, said at least one said receiving circuit comprising n signal terminals, a common terminal and a reference terminal, each of the signal terminals being coupled to one and only one of the transmission conductors, the common terminal being coupled to each of the elementary return conductors, the reference terminal being connected to each of the elementary reference conductors, each of the output signals of the receiving circuit being mainly determined by one or more of the voltages between one of the signal terminals and the common terminal.

2. The device for transmission of claim 1, wherein the interconnection is such that, at the given point along the interconnection, in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the shortest distance between the transmission conductor number j and any one of the elementary reference conductors.

3. The device for transmission of claim 1, wherein, in a section of the interconnection and of the elementary reference conductors in the plane orthogonal to the direction of propagation of signals in the interconnection, each one of the transmission conductors is closer to the nearest elementary return conductor than to the nearest elementary reference conductor.

4. The device for transmission of claim 1, wherein r is an integer greater than or equal to n−1, and wherein over at least 9/10 of the length of the interconnection, in a section of the interconnection and of the elementary reference conductors in a plane orthogonal to the direction of propagation of signals in the interconnection, for any integer j greater than or equal to 1 and less than or equal to r−1 and to n, the distance between the transmission conductor number j and the elementary return conductor number j and the distance between the transmission conductor number j and the elementary return conductor number j+1 are both less than the half of the shortest distance between the transmission conductor number j and any other transmission conductor of the interconnection, less than the half of the distance between the elementary return conductor number j and the elementary return conductor number j+1, and less than the half of the shortest distance between the transmission conductor number j and any one of the elementary reference conductors.

5. The device for transmission of claim 1, further comprising a termination circuit having n signal nodes, each of the signal nodes being coupled to one and only one of the transmission conductors, each of the transmission conductors being coupled to one and only one of the signal nodes, the termination circuit having a common node connected to each of the elementary return conductors, the termination circuit being, when the termination circuit is in the activated state, approximately equivalent, for the signal nodes and the common node, to a (n+1)-terminal network.

6. The device for transmission of claim 5, wherein the (n+1)-terminal network is a linear (n+1)-terminal network such that, in a part of the known frequency band, the impedance matrix of the (n+1)-terminal network, with respect to the common node, is equal to a wanted diagonal matrix of size n×n.

7. The device for transmission of claim 5, wherein the (n+1)-terminal network is a linear (n+1)-terminal network such that, in a part of the known frequency band, the impedance matrix of the (n+1)-terminal network, with respect to the common node, is equal to a wanted non-diagonal matrix of size n×n.

8. The device for transmission of claim 1, further comprising a termination circuit having n signal nodes, each of the signal nodes being coupled to one and only one of the transmission conductors, each of the transmission conductors being coupled to one and only one of the signal nodes, the termination circuit having a common node connected to each of the elementary return conductors, the termination circuit having a ground node connected to each of the elementary reference conductors, the termination circuit being, when the termination circuit is in the activated state, approximately equivalent, for the signal nodes, the common node and the ground node, to a (n+2)-terminal network such that, at least one quiescent operating point, for small signals in a part of the known frequency band, the impedance matrix, with respect to the ground node, of the (n+2)-terminal network is equal to a wanted matrix of size (n+1)×(n+1).

9. The device for transmission of claim 1, wherein all conductors of the interconnection are traces built in only one conducting layer of a printed circuit board.

10. The device for transmission of claim 1, wherein all conductors of the interconnection are traces built in only one conducting layer of a substrate of a multi-chip module.

11. The device for transmission of claim 1, wherein all conductors of the interconnection are built in only one metallization level of a chip.

* * * * *